United States Patent [19]

Stewart et al.

[11] 4,279,785
[45] Jul. 21, 1981

[54] GLASS ENCAPSULATION OF SEMICONDUCTOR DEVICES

[75] Inventors: Clive E. E. Stewart, Bishops Stortford; William J. N. Rosser, Stansted Mount Fitchet; Martin P. Ansell, Bath, all of England

[73] Assignee: ITT Industries, Inc., New York, N.Y.

[21] Appl. No.: 91,916

[22] Filed: Nov. 6, 1979

[30] Foreign Application Priority Data

Nov. 28, 1978 [GB] United Kingdom .............. 46345/78

[51] Int. Cl.³ .......................... C03C 3/16; C03C 3/12; H01B 1/08
[52] U.S. Cl. ................................. 252/518; 106/47 R
[58] Field of Search ....................... 106/47 R; 252/518

[56] References Cited

U.S. PATENT DOCUMENTS

| | | | |
|---|---|---|---|
| 3,278,317 | 10/1966 | Blair et al. | 106/47 R |
| 3,518,209 | 6/1970 | Provance | 106/47 R X |
| 3,520,831 | 7/1970 | Trap et al. | 106/47 R |
| 3,885,974 | 5/1975 | Asahara et al. | 106/47 Q |

FOREIGN PATENT DOCUMENTS 744947 2/1956 United Kingdom .
1479956 7/1977 United Kingdom .

OTHER PUBLICATIONS

Hackh's Chemical Dictionary-4th edition-pub. McGraw-Hill Co. NY p. 141 "Cellosolve".

*Primary Examiner*—Helen M. McCarthy
*Attorney, Agent, or Firm*—John T. O'Halloran; David M. Quinlan

[57] ABSTRACT

A low melting point glass for semiconductor device encapsulation. The glass is based on the lead oxide/phosphorus pentoxide/vanadium pentoxide system and has a thermal coefficient of expansion similar to that of a copper alloy lead frame. The glass is applied to a device as a frit which is then heat fused.

5 Claims, 4 Drawing Figures

Typical resistivity of $PbO-V_2O_5-P_2O_5$ glasses as a function of $V_2O_5$ content.

Typical resistivity of $PbO-V_2O_5-P_2O_5$ glasses as a function of $V_2O_5$ content.

GLASS ENCAPSULATION OF SEMICONDUCTOR DEVICES

This invention relates to glass compositions, and in particular to glass compositions suitable for encapsulating electronic, e.g. semiconductor, devices.

Encapsulation or packaging of a semiconductor device is essential to ensure that the device maintains its electrical characteristics throughout its operating life. The package of the device has the twofold objective of protecting the device by providing an hermetic seal against moisture and contaminants and providing a suitable shape e.g. for automatic handling to facilitate circuit fabrication. Existing hermetic package systems, which combine chip passivation, with silica or silicon nitride, and/or a phosphosilicate glass coating, provide adequate device protection but have certain disadvantages. For this reason the use of relatively cheap plastics packaging is increasingly employed in the semiconductor industry. Whilst the plastics encapsulation process is well understood and the material is relatively cheap there are some applications in which the plastics does not provide adequate protection of the device. Thus in high humidity environment, such devices are subject to moisture penetration along the header leads. Also many plastics contain impurities which can have a detrimental effect on certain surface sensitive devices.

The object of the invention is to minimise or to overcome these disadvantages.

According to one aspect of the invention there is provided a glass composition 56 to 58 mol % lead oxide (PbO), 22 to 28 mol % vanadium pentoxide ($V_2O_5$) and 16 to 20 mol % phosphorus pentoxide.

According to another aspect of the invention there is provided a method of forming a lead phosphovanadate glass, including fusing a mixture of lead oxide (PbO) with an excess of phosphorus pentoxide ($P_2O_5$) at a temperature of 1000° C. to 1200° C., cooling the fused mixture, adding vanadium pentoxide and further lead oxide to the mixture and refusing at a temperature of 1000° to 1200° C., maintaining the fused melt at a temperature of 750° to 850° C. whilst bubbling oxygen through the molten glass, and casting the glass.

According to a further aspect of the invention there is provided a method of encapsulating a semiconductor device, including coating the device with a lead phosphovanadate glass frit containing a volatile organic liquid, heating the device to a first relatively low temperature so as to evaporate the liquid, and heating the device to a second temperature sufficient for the glass to fuse to form a uniform coating on the device, and in which the glass comprises lead oxide (PbO), vanadium pentoxide ($V_2O_5$) and phosphorus pentoxide ($P_2O_5$) the vanadium pentoxide content of the glass not exceeding 28 mol %.

Embodiments of the invention will now be described with reference to the accompanying drawings in which.

Figure 1:
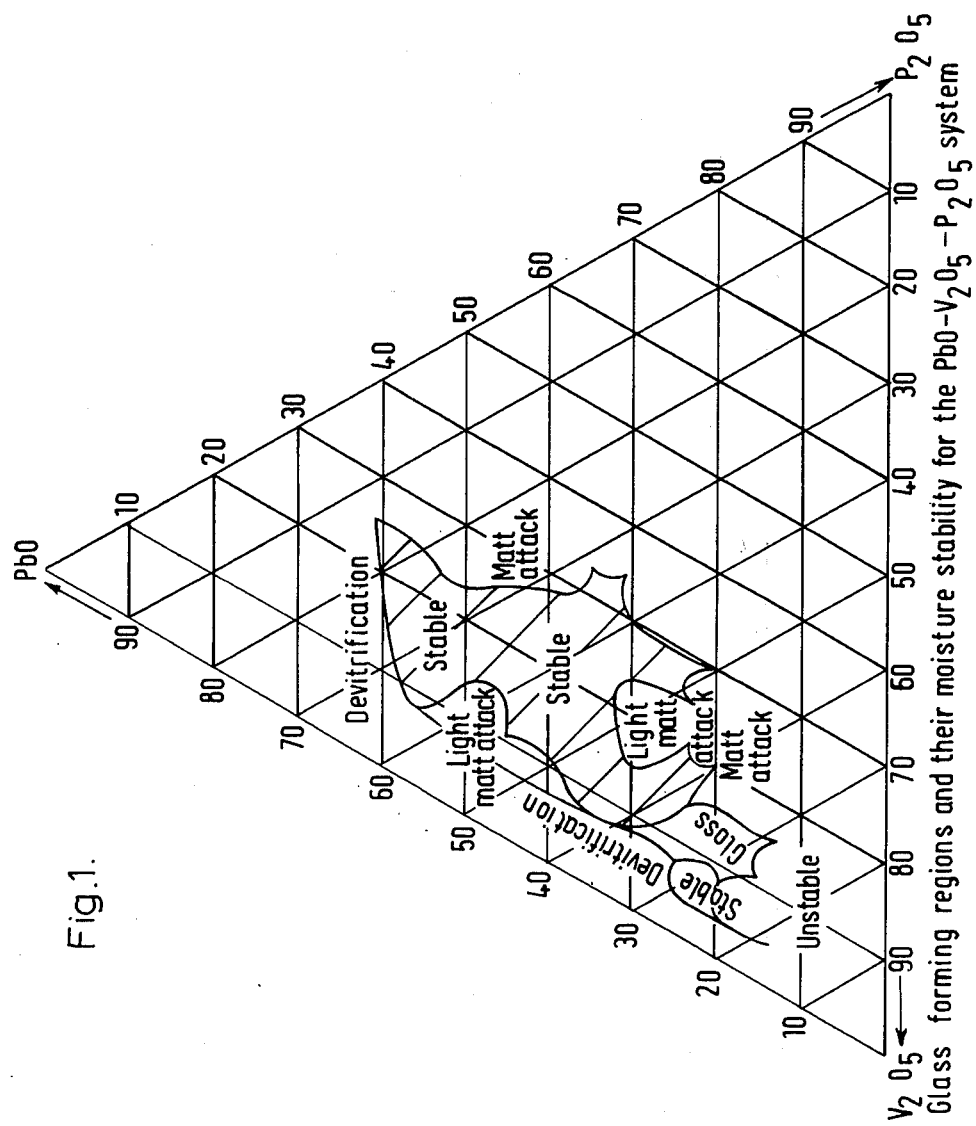
FIG. 1 is a phase diagram of the lead oxide/phosphorus pentoxide/vanadium pentoxide system showing the glass forming region.
Figure 2:
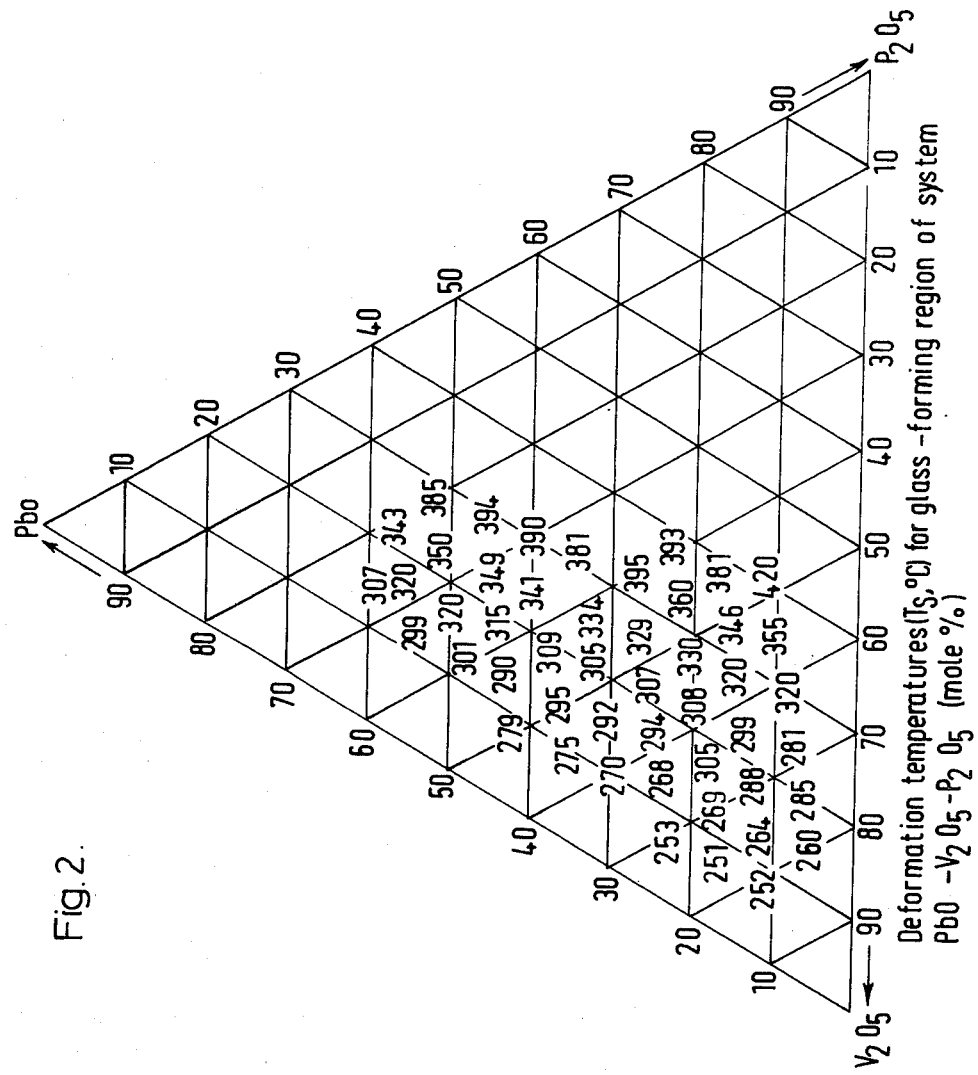
FIG. 2 is a similar phase diagram showing the deformation temperatures of the glasses of FIG. 1.
Figure 4:
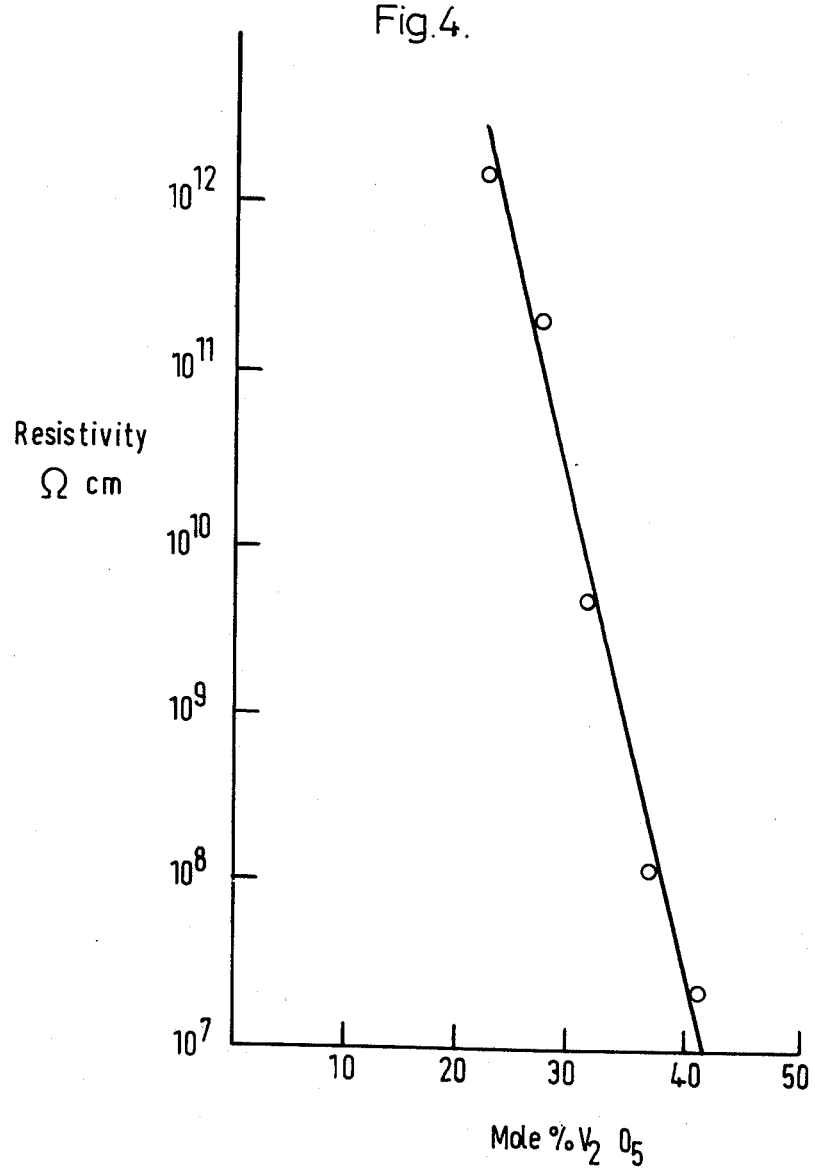

and FIG. 4 indicates the typical relationship between vanadium content and electrical resistivity of the glasses of FIG. 1.

Referring to the drawings, glass compositions may be prepared by thoroughly mixing weighed quantities of the dry powdered constituents followed by firing in an oxidising atmosphere at a temperature of 1000° C. to 1200° C. in an electric furnace. After fusion for 15 minutes the melt is cast on to a cooled stainless steel plate. Stable glass compositions are black and shiny in appearance whilst those with a tendency to devitrify may be recognised by their grey appearance and the presence of hexagonal crystallites. The shaded region of the phase diagram of FIG. 1 indicates the preferred composition boundary within which glasses are obtained. Outside this boundary the glass compositions are unstable, readily attacked by moisture or subject to de-vitrification. It has been found that glass compositions within the boundary remain unaffected even when subjected to an atmosphere of 75% humidity at 85° C. for 120 days. Glasses outside the boundary, and particularly those with a high phosphorous pentoxide or vanadium pentoxide content absorb moisture which expands the glass eventually leading to crumbling. Where such degradation is less severe a matt discolouration appears on the glass surface.

In a preferred method of glass preparation weighed quantities of lead oxide (PbO) and anhydrous phosphorus pentoxide are fused at 1000° to 1200° C. followed by coding and reweighing to determine the loss of phosphorus pentoxide by evaporation. The necessary quantities of vanadium pentoxide ($V_2O_5$) and lead oxide are added to the lead phosphate to produce the required glass composition and the mix is again fused at 1000° to 1200° C. The melt is allowed to cool to between 750° C. and 850° C., preferably 800° C., and oxygen is bubbled through the molten glass for two hours to ensure that the glass acquires its maximum resistivity. Finally the melt is cast on to a cooled stainless steel plate and is crushed into powder.

It has been found that the resistivity of the glass composition is a function of its vanadium content, the higher vanadium content glasses exhibiting a lower resistivity. This effect is demonstrated in FIG. 4 which illustrates the general relationship between vanadium content and the resistivity of a typical glass of the type described herein. The resistivity of any particular glass will of course depend on the method of preparation employed. It is thought that the lower resistivity of the high vanadium glasses arises from changes in oxidation states between $V^{4+}$ and $V^{5+}$ ions in the glass. Treating the molten glass with oxygen ensures that most of the vanadium content is in its pentavalent state.

For semiconductor device packaging it is preferred that the encapsulating glass should have a resistivity of at least $10^{11}$ ohm cm. To meet this requirement the vanadium content of the glass composition should not exceed 28 mol %. This is the maximum vanadium content for glasses which have been treated by oxygenation. Where this treatment has not been applied the maximum vanadium content for a resistivity in excess of $10^{11}$ ohm cm is of course lower.

The glass may be applied to semiconductor devices in the form of a frit together with a binder and an organic liquid vehicle. Typically the binder may comprise pyroxylin and the vehicle may comprise 2 butoxy-ethanol or isopropyl alcohol. In the latter case the binder may be omitted in some applications. The material is applied to the semiconductor as a paste and the coated device is heated, e.g. under an infra-red lamp, to a sufficient temperature to evaporate the organic vehicle. The device is then heated to a temperature between 350° and 375° C. to decompose the binder, where a binder has been employed, and fuse the glass into an homogeneous uniform coating. The firing time may be from 5 to 30 minutes depending on the softening and flow characteristics of the particular glass composition used.

Figure 3:
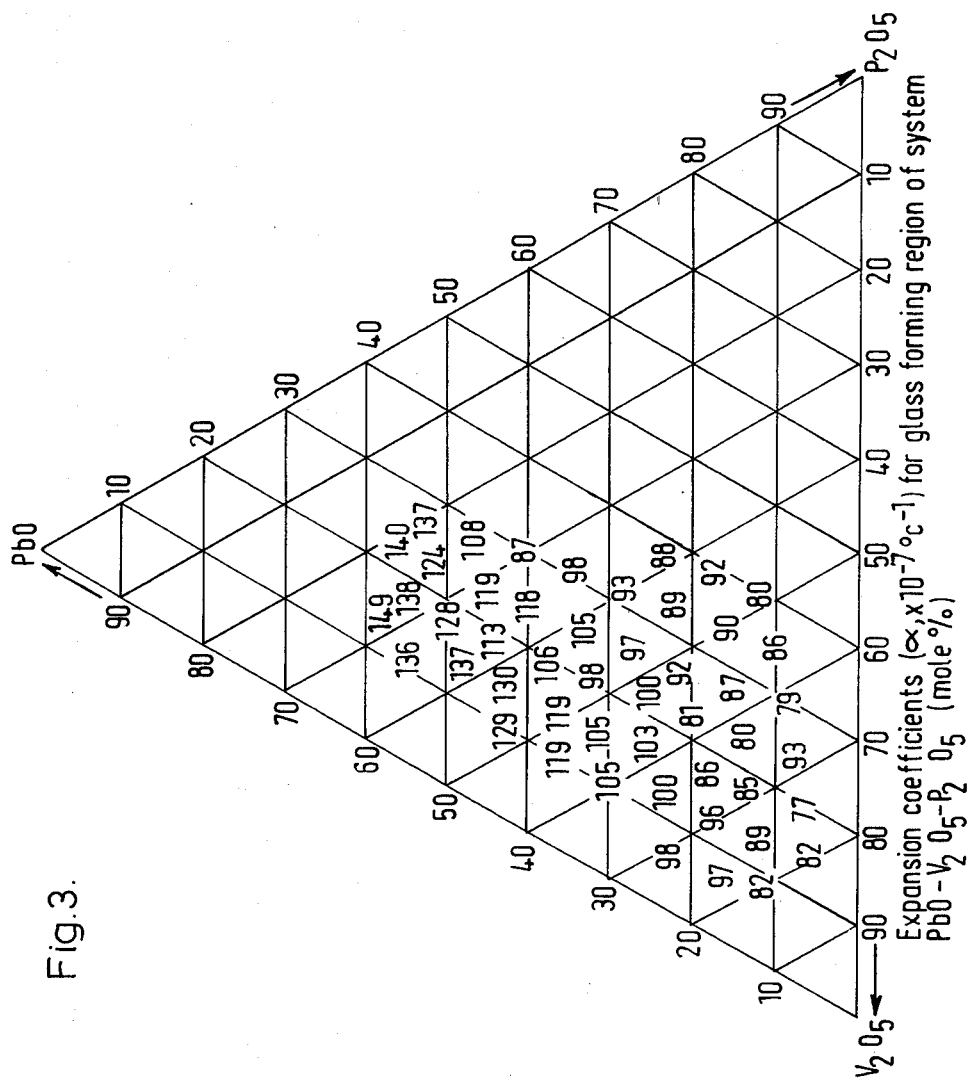
FIG. 3 is a further phase diagram showing the thermal expansion coefficient of the glasses of FIG. 1.

In order to minimise the risk of cracking of the glass coating around the leads of the device it is preferable that the linear expansion coefficient of the glass should match that of the leads. The lead material commonly in use at present is a copper alloy comprising 98 weight % copper and 2 weight % iron, this material having a linear coefficient of thermal expansion of $155 \times 10^{-7}/°$C. The relationship between glass composition and expansion coefficient is demonstrated in the phase diagram of FIG. 3. The preferred composition should be in the range $57 \pm 1$ mol % lead oxide $25 \pm 3$ mol % vanadium pentoxide and $18 \pm 2$ mol % phosphorus pentoxide. Although this composition range is close to the devitrification boundary at the high PbO edge of the stable glass region of the phase diagram of FIG. 1, it is found that glasses within this composition range have adequate stability. As the vanadium pentoxide content of these glasses is not greater than 28 mol % their electrical resistivity is sufficiently high for semiconductor encapsulation.

The following example illustrates the invention:

EXAMPLE

A glass having the measured composition
56 mol % lead oxide
27 mol % vanadium pentoxide
17 mol % phosphorus pentoxide
was prepared by fusion of weighed quantities of substantially anhydrous lead oxide and phosphorus pentoxide for 15 min. at 1100° C. After cooling and weighing, weighed quantities of vanadium pentoxide and further lead oxide were added and the mix again fused for 15 min. at 1100° C. The melt was allowed to cool to 800° C. and maintained at that temperature for 2 hours whilst oxygen was bubbled through the molten glass. Finally the glass was cast on to a cold stainless steel plate, crushed to powder, and sieved to provide a material comprising particles in the range 5 to 40 microns in diameter.

The glass was found to have a resistivity of $5 \times 10^{11}$ ohm cm, a softening temperature of 319° C. and a coefficient of thermal expansion of $150 \times 10^{-7}/°$ C., this latter comparing favourably with that of the copper alloy commonly used for semiconductor device leadframes.

The glass frit or powder was divided into two portions one of which was mixed with a pyroxilin (cellulose nitrate) binder dissolved in 2-butoxy ethanol. The other portion of the glass frit was mixed with isopropyl alcohol (IPA). A number of n-p-n and p-n-p bipolar silicon transistors epoxy bonded on to silver plated copper alloy lead frames were coated with one or other of the glass frit mixtures and were dried for 10 min. under an infrared lamp. The devices were then heated in air to a temperature of 365° C. for 8 min. to fuse the glass coating. Such devices were encapsulated at one time and constituted a batch.

The transistors were then subjected to electrical evaluation, measurements were made of the small signal current gain ($h_{fe}$) with a base bias of 0.01mA, and of the collector-base reverse leakage current $I_{CBO}$ at 20 volts reverse bias. It was found that, after encapsulation, the leakage current ($I_{CBO}$) and gain ($h_{fe}$) was still well within the manufacturer's specification for the types of transistor employed.

We claim:

1. A glass composition consisting essentially of 56 to 58 mol % lead oxide (PbO), 22 to 28 mol % vanadium pentoxide ($V_2O_5$) and 16 to 20 mol % phosphorus pentoxide ($P_2O_5$) wherein the bulk resistivity of said glass composition is at least $1 \times 10^{11}$ ohm cm. and the coefficient of thermal expansion of said glass composition is greater than $120 \times 10^{-7}/°$ C.

2. A glass composition consisting essentially of 56 mol % lead oxide (PbO), 27 mol % vanadium pentoxide ($V_2O_5$) and 17 mol % phosphorus pentoxide ($P_2O_5$) wherein the bulk resistivity of said glass composition is substantially equal to $5 \times 10^{11}$ ohm cm. and the coefficient of thermal expansion of said glass composition is substantially equal to $150 \times 10^{-7}/°$ C.

3. A powdered glass frit composition for encapsulating an electronic device, said composition including a glass as claimed in claim 1 or 6 together with a volatile organic liquid vehicle.

4. A glass frit composition as claimed in claim 3, and which further includes an organic binder.

5. A glass frit composition as claimed in claim 4, wherein said liquid is 2-butoxyethanol and the binder is cellulose nitrate.

* * * * *